United States Patent [19]

Hara

[11] Patent Number: 4,754,418
[45] Date of Patent: Jun. 28, 1988

[54] COMBINED ELECTRONIC CALCULATOR AND CREDIT CARD

[75] Inventor: Kazuya Hara, Tokyo, Japan

[73] Assignee: Casio Computer Co., Ltd., Tokyo, Japan

[21] Appl. No.: 711,422

[22] Filed: Mar. 13, 1985

[30] Foreign Application Priority Data

| Mar. 27, 1984 | [JP] | Japan | 59-43975[U] |
| Aug. 15, 1984 | [JP] | Japan | 59-124608[U] |
| Aug. 17, 1984 | [JP] | Japan | 59-124706[U] |

[51] Int. Cl.4 .................. G06F 15/02; G06K 5/00
[52] U.S. Cl. ......................... 364/708; 235/380
[58] Field of Search ................. 364/705–708, 364/712; 235/380, 379, 488, 381, 382, 493

[56] References Cited

U.S. PATENT DOCUMENTS

| 3,651,312 | 3/1972 | Barney | 235/488 |
| 4,013,894 | 3/1977 | Foote et al. | 235/380 |
| 4,092,526 | 5/1978 | Beck | 235/419 |
| 4,096,577 | 6/1978 | Ferber et al. | 364/712 |
| 4,152,476 | 5/1979 | Stillman | 235/493 |
| 4,158,230 | 6/1979 | Washizuka et al. | 364/709 |
| 4,222,516 | 9/1980 | Badet et al. | 235/492 |
| 4,261,042 | 4/1981 | Ishiwatari et al. | 364/709 |
| 4,263,659 | 4/1981 | Hirata et al. | 364/709 |
| 4,356,391 | 10/1982 | Takeda | 235/493 |
| 4,529,870 | 7/1985 | Chaum | 235/380 |
| 4,558,427 | 12/1985 | Takeuchi et al. | 364/708 |
| 4,563,575 | 1/1986 | Hoppe et al. | 235/488 |
| 4,614,861 | 9/1986 | Pavlov et al. | 235/380 |
| 4,620,727 | 11/1986 | Stockburger et al. | 235/380 |
| 4,627,736 | 12/1986 | Komaki | 364/708 |
| 4,670,664 | 6/1987 | Hara | 364/712 X |
| 4,680,724 | 7/1987 | Sugiyama et al. | 364/708 |

FOREIGN PATENT DOCUMENTS

| 0068539 | 1/1983 | European Pat. Off. . |
| 1492822 | 3/1975 | United Kingdom . |
| 2112324 | 7/1983 | United Kingdom . |
| 2116777 | 9/1983 | United Kingdom . |

OTHER PUBLICATIONS

IEEE Spectrum, vol. 11, No. 12, Dec. '74, pp. 56–62, N.Y., U.S.; Svigals et al.: "Magnetic-Stripe Credit Cards: Big Business in the Offing".

Primary Examiner—Gary V. Harkcom
Assistant Examiner—Tan V. Mai
Attorney, Agent, or Firm—Frishauf, Holtz, Goodman & Woodward

[57] ABSTRACT

A key input unit, a display unit and a solar cell are arranged on one surface of a card-like electronic calculator. This surface serves as an electronic calculator. The outer shape of the card-like electronic calculator is the same as that of a credit card. Furthermore, a magnetic stripe portion on which predetermined data is recorded, and embossed portions for displaying information are formed on the other surface of the calculator. Therefore, the calculator also serves as a credit card.

18 Claims, 7 Drawing Sheets

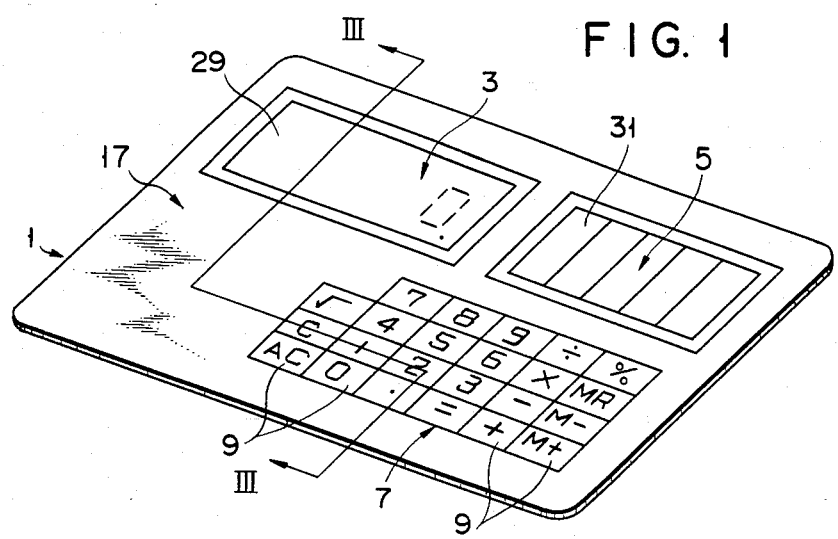
FIG. 1
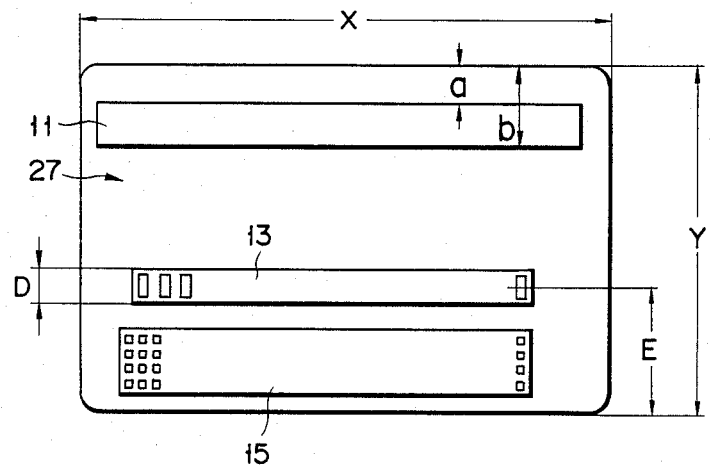
FIG. 2
FIG. 5
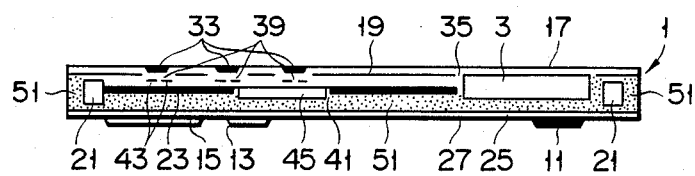
FIG. 3

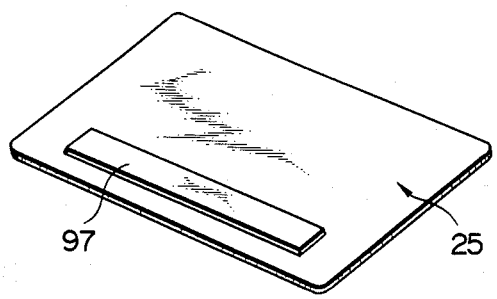
F I G. 10
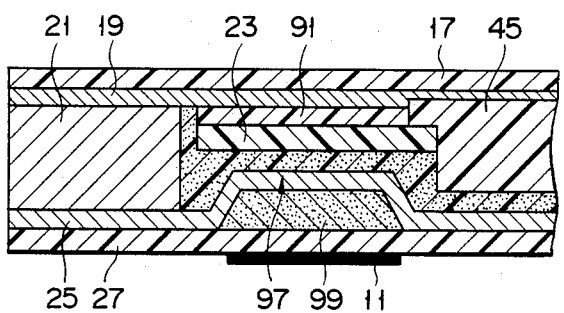
F I G. 11
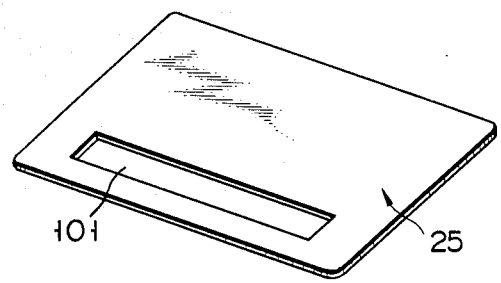
F I G. 12

COMBINED ELECTRONIC CALCULATOR AND CREDIT CARD

BACKGROUND OF THE INVENTION

The present invention relates to a card-like electronic apparatus with a credit card function.

Recently, compact electronic calculators have become very thin, for example, an electronic calculator described in Japanese Patent Disclosure No. 58-207163 (U.S. application No. 468,401 filed 02/22/83) has a thickness of only 0.8 mm. Meanwhile, the credit card system has greatly expanded with a large number of banking, financial, and service institutions, and the like now issuing such cards. In Japan, for example, the total number of these credit cards already exceeds one hundred million, with a large number of people having more than one credit card. However, at present they must hold their electronic calculators and credit cards separately, which results in inconvenience.

SUMMARY OF THE INVENTION

It is an object of the present invention to provide a card-like electronic apparatus which functions as a credit card and to widen the range of application of electronic apparatus.

Card-like electronic apparatus according to the present invention comprises:

an electronic apparatus module means, which has, at least, a key input means for inputting calculation data, an electronic circuit means for receiving a key operation signal from said key input means so as to perform a calculation operation corresponding to the key operation signal, and a display unit for displaying a calculation result of said electronic circuit means corresponding to an output signal from said electronic circuit means;

a surface casing means covering one surface of said electronic apparatus module means and having a flexible sheet member which is substantially flat and has at least one operating surface for supplying a key operation signal to said key input means; and a credit card section which has a holding sheet which holds the other surface of said electronic apparatus and whose outer surface side is substantially flat, and a sheet member adhered to said holding sheet and having an information portion for holding predetermined identification data.

With this arrangement, the electronic apparatus can also serve as the credit card.

BRIEF DESCRIPTION OF THE DRAWINGS

FIG. 1 is a perspective view of an electronic calculator according to the first embodiment of the present invention;

FIG. 2 is a front view of the lowermost sheet of the electronic calculator shown in FIG. 1;

FIG. 3 is a sectional view taken along a line III—III of the electronic calculator shown in FIG. 1;

FIG. 5 is a side view of the electronic calculator shown in FIG. 1;

FIGS. 10 to 13 are views for explaining other arrangements of a lower sheet;

DETAILED DESCRIPTION OF THE PREFERRED EMBODIMENTS

Figure 4:
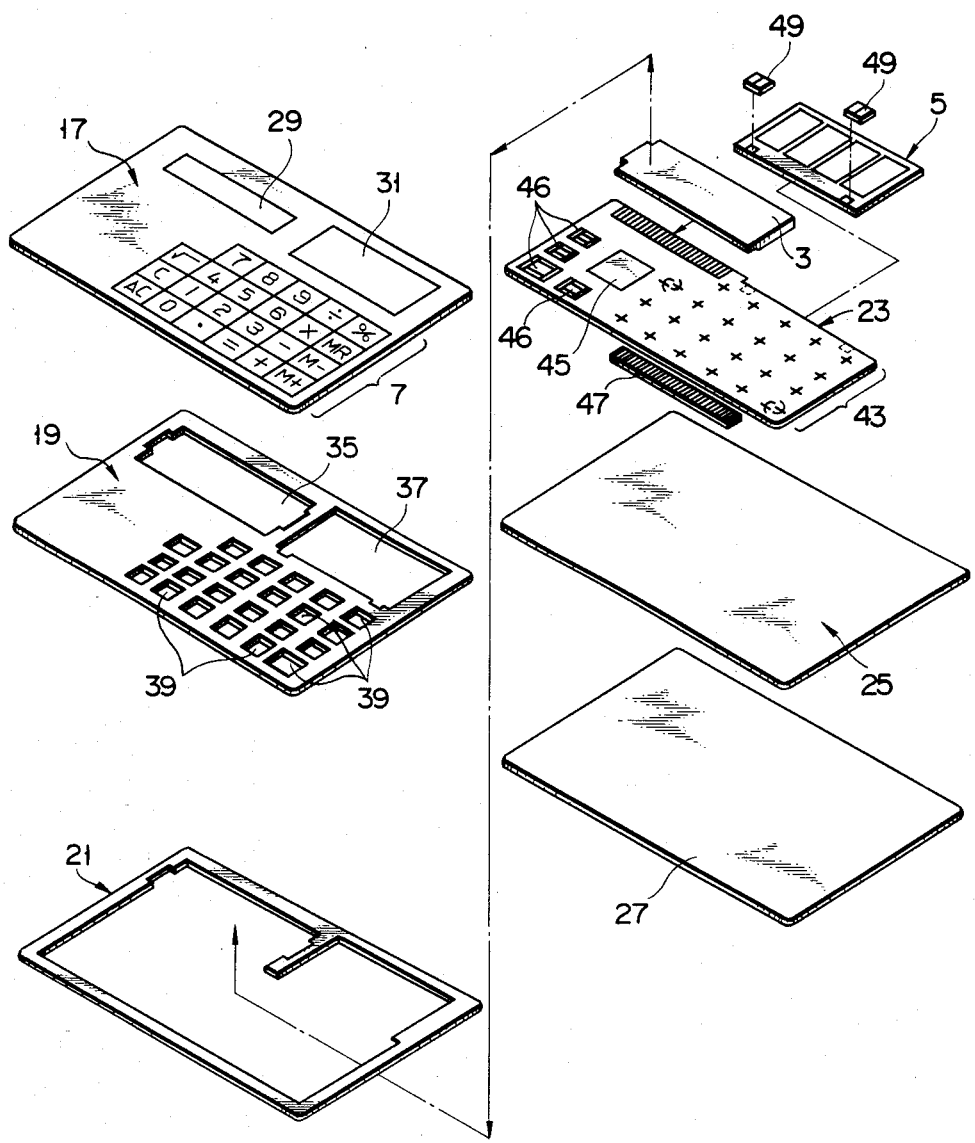
FIG. 4 is an exploded view of the calculator shown in FIG. 1.

A card-like electronic calculator with a credit card function according to the first embodiment of the present invention will be described hereinafter with reference to FIGS. 1 to 5.

As shown in FIG. 1, a liquid crystal display unit 3, a solar cell 5 and a keyboard unit 7 are provided in the top surface side of an electronic calculator 1. The display unit 3 comprises a liquid crystal display cell in which a liquid crystal element is sealed between a pair of film base materials, such as polyester films. The display unit 3 is used for displaying data such as calculation data, a calculation result and the like. The solar cell 5 comprises a solar cell element which is formed on a film base material and has an epoxy resin roll-coated thereon. The solar cell 5 is a power supply source of the calculator 1. The keyboard unit 7 comprises various keys 9 such as numerical and function keys for inputting data such as calculation data.

A magnetic stripe portion 11 and first and second embossed portions 13 and 15 are provided on the back surface of the calculator 1, as shown in FIG. 2. Various magnetic data are recorded on the magnetic stripe portion 11. The first and second embossed portions 13 and 15 have identification data of the calculator 1.

An arrangement of the calculator 1 will be described with reference to FIGS. 3 and 4. The calculator 1 is constructed by overlying an uppermost sheet 17, an upper sheet 19, a frame 21, a circuit board 23, a lower sheet 25 and the lowermost sheet 27 on each other in the above order. The uppermost sheet 17 is a resin film such as a polyester film and is adhered to the upper sheet 19. Transparent windows 29 and 31 are formed in portions of the sheet 17 corresponding to the display unit 3 and the solar cell 5. Key indicia are printed on the sheet 17 at positions corresponding to the keys 9 of the keyboard unit 7. A remaining portion is colored, or a figure is printed thereon. Movable contacts 33 (FIG. 3) are provided on an inner surface of the sheet 17 at positions corresponding to the keys 9.

The upper sheet 19 is formed of a flexible resin such as vinyl chloride. Openings 35 and 37 are formed in the upper sheet 19. These openings 35 and 37 are formed to correspond to the windows 29 and 31 of the sheet 17. Openings 39 are formed in the sheet 19 so as to correspond to the keys 9. When the keys 9 are depressed, the contacts 33 are brought into contact with stationary contacts 43 (to be described later) through the openings 39.

The circuit board 23 is attached to the lower surface of the upper sheet 19. The circuit board 23 is a film sheet. The contacts 43 are provided on an upper surface of the board 23. When one of the keys 9 is depressed it corresponding contact 33 is brought into contact with the corresponding contact 43. The contacts 43 are of a split type. One end of each split type contact 43 is connected to a timing pulse output terminal of an integrated circuit 45 (to be described later). The other end of each contact 43 is connected to an input terminal of the integrated circuit 45. The keys 9, the movable contacts 33 and the stationary contacts 43 constitute the keyboard unit 7.

Openings 41 are formed in the circuit board 23. The integrated circuit 45 and chip parts 46 are mounted in the openings 41. Thus, the thickness of the integrated circuit 45 and chip parts 46 does not affect that of the calculator 1. The display unit 3 and the solar cell 5 are connected through heat seals 47 and 49. Respective electrode terminals (not shown) of the display unit 3 and the solar cell 5 are connected to the board 23. The display unit 3 is arranged in the opening 35 of the upper sheet 19 and is adhered to the lower surface of the display window 29 of the uppermost sheet 17. The solar cell 5 is arranged in the opening 37 of the upper sheet 19 and is adhered to the lower surface of the window 31 of the sheet 17.

The lower sheet 25 is adhered to the lower surface of the circuit board 23. The lower sheet 25 is a flexible sheet made of hard vinyl chloride. The frame 21 is formed of a flexible resin such as hard vinyl chloride. The circuit board 23 is arranged in the frame 21. The board 23 is fixed by an adhesive 51, for example, epoxy region which is used between the board 23, the frame 21 and the lower sheet 25. The adhesive 51 is also used around an outer periphery of the frame 21, to seal the uppermost sheet 17 and the lowermost sheet 27. The lowermost sheet 27 is adhered to the lower sheet 25. As described above, the lowermost sheet is provided with the magnetic stripe portion 11 and the embossed portions 13 and 15.

Thicknesses of the respective portions described above are as follows: the uppermost sheet 17, about 0.08 mm; the upper sheet 19, 0.1 mm; the display unit 3, 0.55 mm; the solar cell 5, 0.2 mm; the circuit board 23, 0.25 mm; the frame 21, 0.4 mm; the integrated circuit 45, 0.4 mm; the lower sheet 25, 0.1 mm; and the lowermost sheet 27, 0.05 mm. The calculator 1 has an overall thickness of about 0.8 mm, a length of 85.5 mm and a width of 54 mm. This size is the same as that of a credit card.

Note that the term credit card is used here to define a card having identification data such as a plastic card (so-called credit card) which a consumer presents for payment in credit sales and for identifying a membership number, a card (cash card) for withdrawing and depositing money in a bank, an identification card, and the like.

An arrangement of the lowermost sheet 27 will be described in detail with reference to FIGS. 2 and 5.

As shown in FIG. 2, the magnetic stripe portion 11 is formed longitudinally at an upper end portion of the sheet 27 in the calculator 1. The portion 11 can be formed by fixing a magnetic sheet on the lowermost sheet 27. Furthermore, the first and second embossed portions 13 and 15 are formed on the lower side of the sheet 27 along the longitudinal direction of the calculator 1. Magnetic data such as a password or a membership number is recorded on the magnetic stripe portion 11. The data can be recorded by a conventional method. Characters and numerals projecting from the sheet 27 are arranged on the first and second embossed portions 13 and 15 so as to present predetermined information. The portion 13 has identification code data. Identification data such as the name of the holder of this calculator 1, an aquisition date, or the like is embossed on the second embossed portion 15. These portions 13 and 15 are formed by screen-printing a vinyl chloride resin on the sheet 27 several times. The outer shape of this calculator 1 and the positions of the first and second embossed portions 13 and 15 and the magnetic stripe portion 11 are suited for an I-type card prescribed in ISO 2894, ISO 3554, and JIS B 9560. Therefore, in FIGS. 2 and 5, respective sizes of the respective portions are set as follows. Note that a unit is mm.

| | |
|---|---|
| X = 85.47 to 85.72 | Y = 53.92 to 54.03 |
| Z = 0.76 ± 0.08 | D = 4.32 |
| E = 21.42 ± 0.12 | G = $0.48^{+0}_{-0.05}$ |
| K = $0.46^{+0}_{-0.051}$ | a = 5.54 |
| b = 11.89 | c = 6.35 |

Note that these sizes are shown as an example. In practice, even if these sizes do not completely coincide with the above standard, the cards can be used with current terminal devices and verification machines. If the card is formed, based upon the above sizes and serves as a credit card, the sizes of other portions are not significant.

The calculator 1 can be constructed to include only the embossed portions 13, 15 and not the magnetic stripe portion 11. In this case, the back surface of the calculator is used only to print the identification data of the embossed portion on a slip of paper when inserted in a printer. Thus it is required only that the thickness from the top surface of the calculator 1 to the peak of the embossed portions 13 and 15 (i.e., Z+K and Z+G in FIG. 5) is satisfied. It may be sufficient for the projection height of the embossed portion 13 or 15 (G or K) to have the range between 0.1 to 0.2 mm. Thus the calculator 1 may be slightly large in its thickness. Alternatively, only the magnetic stripe portion 11 can be provided and the embossed portions 13 and 15 can be omitted. In this case, the stripe portion 11 can be arranged at a position on the embossed portion 13 or 15.

Figure 6:
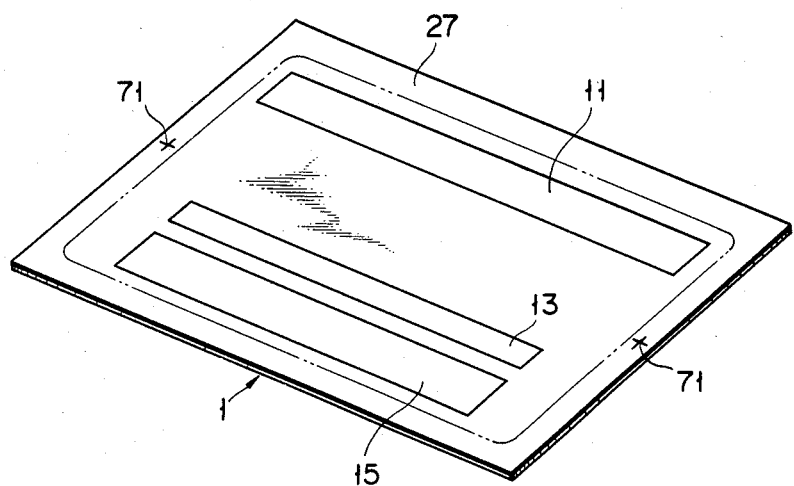
FIG. 6 is a view for explaining a method of assembling the electronic calculator shown in FIG. 1.

A method of assembling the calculator 1 will be described hereinafter with reference to FIG. 6. The uppermost sheet 17 is formed to be larger than the completed calculator 1 shown in FIGS. 1 and 2, and alignment marks (not shown) are printed thereon. The upper sheet 19 and the frame 21 are adhered to the sheet 17. The display unit 3, the solar cell 5, the integrated circuit 45 and the chip parts 46 are mounted on the circuit board 23. The circuit board 23 is placed in the frame 21. The space above the circuit board 23 is filled with the adhesive 51, and the lower sheet 25 is placed thereon. The space around the frame 21 is also filled with the adhesive 51. The lowermost sheet 27, provided with the embossed portions 13 and 15 and the magnetic stripe portion 11, is adhered to the sheet 25. Alignment marks 71 are provided on the lowermost sheet 27 in the same manner as on the sheet 17. When the alignment marks 71 coincide with those of the sheet 17, the sheet 27 is aligned. When the sheet 27 is adhered, the uppermost sheet 17, the upper sheet 19, the adhesive 51, the lower sheet 25 and the lowermost sheet 27 are cut along alternate long and two short-dashed lines in FIG. 6. The above structure is preferably cut about 0.1 to 0.3 mm from frame 21. In this manner, the card-like electronic calculator whose one surface serves as a calculator and the other surface serves as a credit card can be obtained.

An electronic calculator according to this embodiment has the same outer shape as that of a credit card, and has the magnetic stripe portion 11 and the embossed portions 13 and 15. Thus, a user holds a calculator and a credit card.

Figure 7:
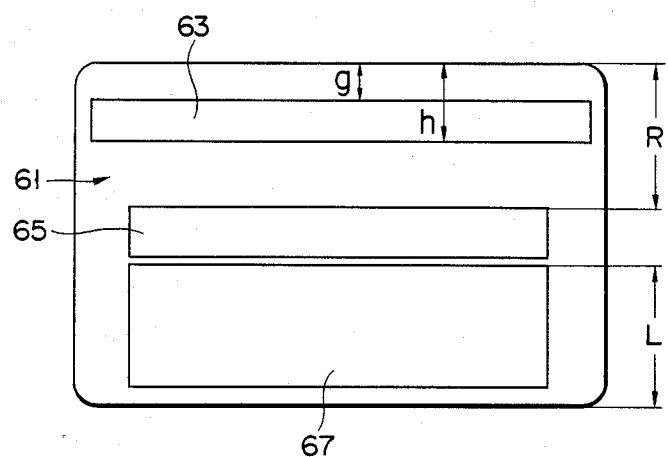
FIGS. 7 and 8 are views for explaining another arrangement of a back surface of the electronic calculator shown in FIG. 2.
Figure 8:
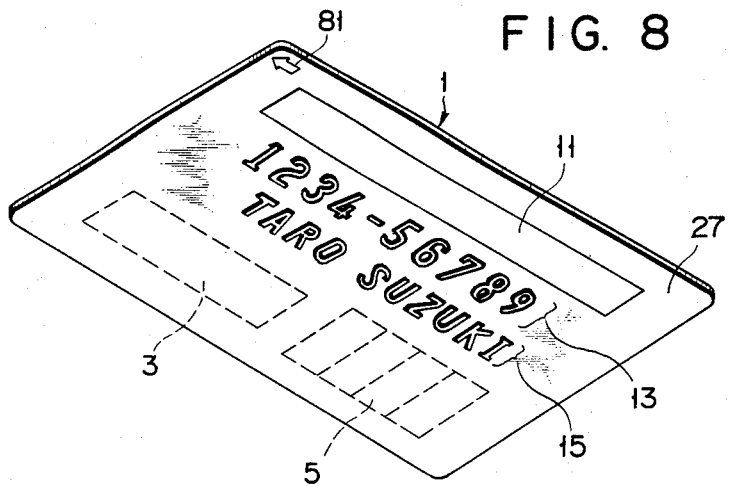

The second embodiment of the present invention will be described with reference to FIGS. 7 and 8. The main difference between the first and second embodiments is in an arrangement of a lowermost sheet. The lowermost sheet 61 shown in FIG. 7 is a II-type card prescribed in Japanese Industrial Standard (JIS) B 9596. The lowermost sheet 61 is provided with a magnetic stripe portion 63, an embossed portion 65 and a signature portion 67. In FIG. 7, respective sizes are as follows. A length L is 24 mm or less, a length g is 6.4 mm or less, a length h is 11.6 mm or more, and a length R is 18.95 mm or less. Note that the signature portion 67 is used for the signature of the holder. As shown in FIG. 8, the magnetic stripe portion 11 and the embossed portions 13 and 15 can be provided at positions excluding those corresponding to the display unit 3 and the solar cell 5 on the back surface of the sheet 27. With this arrangement, a card transfer roller (not shown) of a cash dispenser does not contact the display unit 3 and the solar cell 5. For this reason, the display unit 3 and the solar cell 5 cannot be broken by the roller. In addition, an arrow 81 for indicating the insertion direction of the calculator 1 when it is inserted in the cash dispenser can be printed thereon, as shown in FIG. 8.

Figure 9:
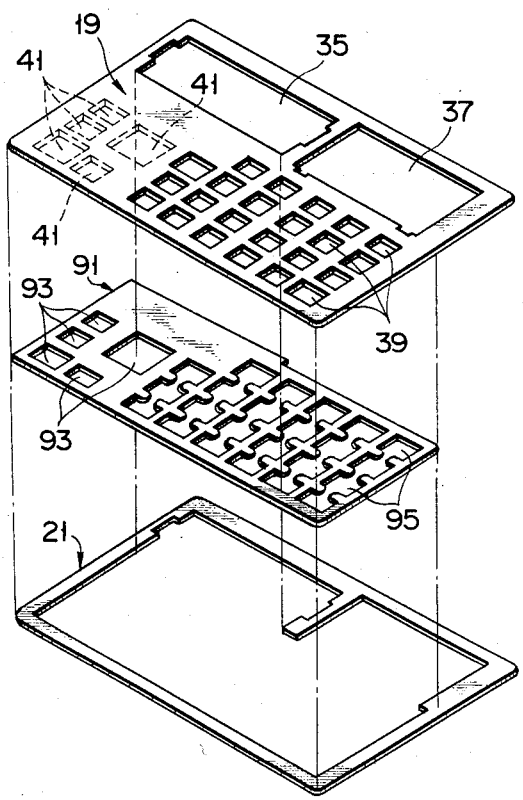
FIG. 9 is an exploded view for explaining another arrangement of an upper sheet of the electronic calculator shown in FIG. 4.

The third embodiment of the present invention will be described with reference to FIG. 9. The main feature of the third embodiment is in an arrangement of the upper and lower sheets 19 and 25. In the above embodiment, the upper and lower sheets 19 and 25 are formed of a flexible resin such as a vinyl chloride resin. However, in this embodiment, in order to protect the internal electronic parts of the electronic calculator and to reinforce the overall calculator, the sheets 19 and 25 are formed of a metal. In the third embodiment, the upper sheet 19 is a thin metal film. The outer shape of the sheet 19 shown in FIG. 9 is the same as that of the sheet 19 shown in FIG. 3. The only difference is in the material they are constructed of. Furthermore, a spacer 91 shown in FIG. 9 is adhered between the upper sheet 19 and the circuit board 23. The spacer 91 is made of polyester, and is provided to prevent the short-circuiting of elements on the circuit board 23. The spacer 91 is adhered to the lower surface of the upper sheet 19, but not over the openings 35 and 37 for the display unit 3 and the solar cell 5. Openings are formed at positions corresponding to the keys 9, i.e., those corresponding to the openings 39 of the sheet 19. The movable contacts 33 are movable through these openings 39, 95 and are brought into contact with the stationary contacts 43. The lower sheet 25 is also formed of a metal, and an outer shape thereof is the same as that of the lower sheet 25 shown in FIG. 3. In the same manner as in the above embodiment, the adhesive 51 is filled between the circuit board 23 and the sheet 25 and around the frame 21. When the integrated circuit 45 and the chip parts 46 are thicker than the circuit board 23 and are projected from an upper surface of the board 23, openings 93 are provided in portions of the spacer 91 corresponding to the electronic parts, and recesses 41 are formed in corresponding portions of the sheet 19. When the calculator 1 is assembled, portions of integrated circuit 45 and the chip parts 46 are fitted into the openings 93 and the recesses 41 and the thickness of the projections thereof does not affect the overall thickness of the calculator.

Data recorded on the magnetic stripe portion 11 must not be magnetically influenced by the upper and lower sheets 19 and 25. For this reason, the sheets 19 and 25 must be formed of a nonmagnetic metal. As a nonmagnetic metal, austinitic stainless steel can be used. However, austinitic stainless steel is magnetized by cold working and turns into a ferromagnet. Thus, a metal of a high nickel (Ni) content such as JIS-SUS32 (AISI-316), JIS-SUS33 (AISI-316L), JIS-SUS41 (AISI-309S), JIS-SUS42 (AISI-310S), JIS-SUH32 (AISI-309), JIS-SUH33 (AISI-310), AISI-305, AISI-314, and the like is preferably used.

With the arrangement described in the third embodiment, the data recorded on the magnetic stripe portion 11 will not be magnetically influenced by the upper and lower sheets 19 and 25. The data recorded on the portion 11 will not be changed, and can be reliably detected. In addition, the electronic calculator 1 can be reinforced.

In the third embodiment, the sheets 19 and 25 are formed of a nonmagnetic metal. However, the present invention is not limited to this. A metal plate adjacent to the magnetic stripe portion 11, i.e., only the lower sheet 25 can be a nonmagnetic metal plate or vinyl chloride film. In this embodiment, the upper and lower sheets 19 and 25 are formed of a metal, and the frame 21 can be.

Figure 13:
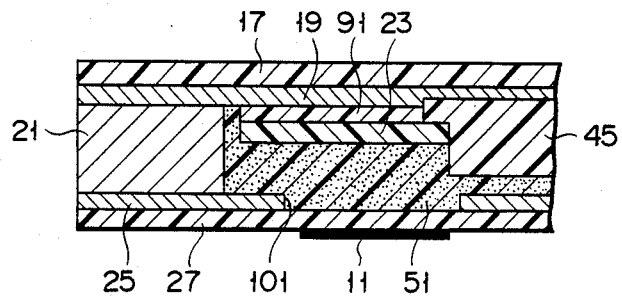

As shown in FIGS. 10 and 11, a recess 97 can be formed in a region of the lower sheet 25 corresponding to the magnetic stripe portion 11. Thus, the stripe portion 11 is separated from the lower sheet 25 so that the stripe portion 11 cannot be magnetically influenced by the sheet 25. In this case, the recess 97 is filled by a filler 99, for holding the lowermost sheet 27 and, particularly, the stripe portion 11, as shown in a sectional view of FIG. 11. Thus, the stripe portion 11 is not subject to the magnetic influence of the sheet 25. As shown in FIGS. 12 and 13, an opening 101 is formed in a portion of the lower sheet 25 corresponding to the stripe portion 11, thus preventing it from being magnetically influenced by the sheet 25. The opening 101 is filled by the adhesive 51, so as to hold the lowermost sheet 27. If the adhesive 51 is nonmagnetic, the stripe portion 11 will not be magnetically influenced.

The fourth embodiment of the present invention will be described hereinafter. In the third embodiment, the embossed portions 13 and 15 are formed by screenprinting the vinyl chloride resin several times. However, the present invention is not limited to this method. For example, instead of the vinyl chloride resin, ultraviolet curing type (UV) ink can be used. When the UV ink is used, it is coated on the sheet 27, which is then masked to form predetermined characters. Ultraviolet light is irradiated so as to cure the predetermined characters, with the uncured portions being removed by a toluene solution.

Figure 14:
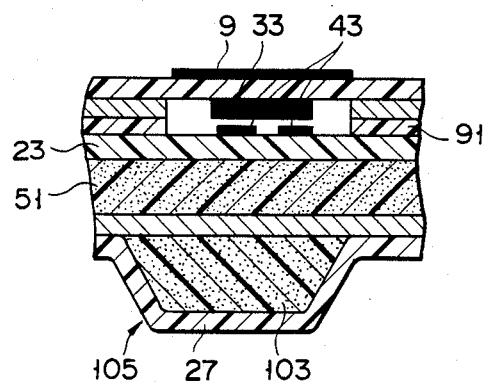
FIGS. 14 and 15 are views for explaining other arrangements of an embossed portion.

As shown in FIG. 14, an embossed portion 105 can be formed by embossing the sheet 27. In this case, a thermal flexible polymeric resin 103 is filled between the embossed portion of the sheet 27 and the sheet 25 so as not to damage the embossed portion 105.

Figure 15:
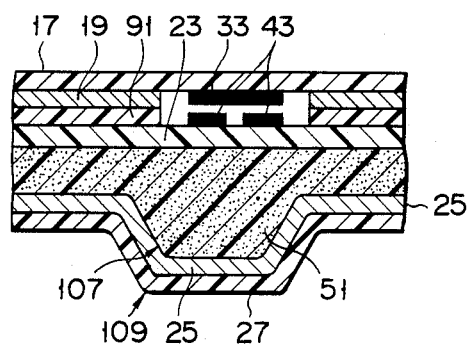

For example, as shown in FIG. 15, the lower sheet 25 may be embossed to form an embossed portion 107 so as to correspond to an embossed portion 109 of the lowermost sheet 27. These embossed portions 107 and 109 are formed by simultaneously embossing the sheets 25 and 27 when the sheet 25 is adhered to the sheet 27. Alternatively, the sheets 25 and 27 can be separately embossed so as to form the embossed portions 107 and 109, and thereafter the sheets 25 and 27 are adhered to each other.

Figure 16:
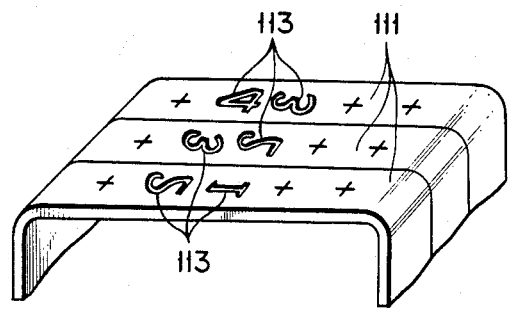
FIGS. 16 and 17 are views for explaining an example of the arrangement of the embossed portion.
Figure 17:
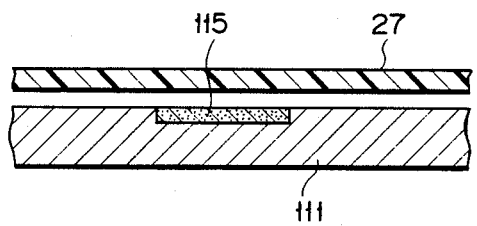

Another method of forming an embossed portion will be described with reference to FIG. 16. In this embodiment, an embossing resin is welded on the uppermost sheet 27 using metal molds 111 so as to form an embossed portion. The embossing resin can be satisfactorily welded on the sheet 27 when they are the same material. Each mold 111 has recesses 113 which are formed in an upper surface thereof and represent characters or symbols. The molds 111 can be rotated for each digit. In order to form an embossed portion, the molds 111 are first rotated so as to combine characters to be formed. Then, the embossing resin is filled in the recesses 113. The molds 111 are heated so that the resin is semi-gelled and adhered to the sheet 27.

In the above embodiments, an electronic calculator with a credit card function has been described. However, the present invention is not limited to these embodiments. The present invention can be widely applied to other card-like electronic apparatus such as an electronic game, a watch, medical apparatus and various combinations thereof.

What is claimed is:

1. Card-like electronic apparatus comprising:
an electronic apparatus module means, which has a key input means for inputting calculation data, an electronic circuit means for receiving a key operation signal from said key input means so as to perform a calculation operation in response to the key operation signal, and a display unit for displaying a calculation result of said electronic circuit means responsive to an output signal from said electronic circuit means;
a surface casing means covering one surface of said electronic apparatus module means and having a sheet member which is flat and including an operating surface for supplying a key operation signal to said key input means; and
a credit card section having a non-magnetic metal plate supporting the other surface of said electronic apparatus module means, and a sheet member adhered to said non-magnetic metal plate and having a magnetic stripe portion on which predetermined magnetic identification data is recorded.

2. Card-like electronic apparatus according to claim 1, wherein said credit card section comprises an embossed portion having predetermined data.

3. Card-like electronic apparatus according to claim 2, wherein said embossed portion is formed by embossing said sheet member.

4. Card-like electronic apparatus according to claim 2, wherein said embossed portion is formed by embossing said sheet member, and a polymeric resin is used on the inner surface of the embossed portion.

5. Card-like electronic apparatus according to claim 2, wherein said embossed portion is formed by welding the polymeric resin to said sheet member.

6. Card-like electronic apparatus according to claim 2, wherein said embossed portion is formed by printing the polymeric resin on said sheet member.

7. Card-like electronic apparatus according to claim 2, wherein said embossed portion is formed by curing ultraviolet-curing type ink on said sheet member.

8. Card-like electronic apparatus according to claim 1, wherein said credit card section comprises a signature portion.

9. Card-like electronic apparatus according to claim 1, wherein said non-magnetic metal plate includes a recess at a position opposing said magnetic stripe portion, and said recess is filled by a nonmagnetic material.

10. Card-like electronic apparatus according to claim 1, wherein said non-magnetic metal plate includes an opening at a position aligned with said magnetic stripe portion, and said opening is filled by a nonmagnetic material.

11. Card-like electronic apparatus according to claim 1, wherein said electronic apparatus section further comprises a battery cell; and said electrical circuit means, said display unit and said battery cell are arranged in substantially the same area as that of a conventional credit card.

12. Card-like electronic apparatus comprising:
an electronic apparatus module means including a key input means for inputting calculation data, an electronic circuit means for receiving a key operation signal from said key input means so as to perform a calculation operation in response to the key operation signal, and a display unit for displaying a calculation result of said electronic circuit means responsive to an output signal from said electronic circuit means;
a surface casing means covering one surface of said electronic apparatus module means and having a sheet member which is flat and including an operating surface for supplying a key operation signal to said key input means;
sheet structure means for supporting said electronic apparatus module means and having a stripe-shaped cavity;
a non-magnetic polymer filler for filling said cavity of said sheet structure means; and
a magnetic stripe means on which predetermined magnetic identification data is recorded, said magnetic stripe means being formed on said sheet structure means in alignment with said stripe-shape cavity.

13. Card-like electronic apparatus according to claim 12, wherein said sheet structure means comprises:
a metal plate having the stripe-shaped cavity filled with said filler; and
a resin sheet member adhered to said metal plate.

14. Card-like electronic apparatus according to claim 13, wherein the cavity in said metal plate defines a stripe-shaped opening.

15. Card-like electronic apparatus according to claim 13, wherein the cavity in said metal plate defines a stripe-shaped recess is formed to face said sheet member.

16. Card-like electronic apparatus according to claim 12, further comprising an embossed portion having predetermined data formed on said sheet structure means.

17. Card-like electronic apparatus according to claim 12, further comprising a signature portion formed on said sheet structure means.

18. Card-like electronic apparatus according to claim 12, wherein said electronic apparatus module means further comprises a battery cell, and wherein said electrical circuit means, said display unit and said battery cell are arranged in substantially the same area as that of a conventional credit card.

* * * * *